United States Patent
Bangar et al.

(10) Patent No.: US 10,429,747 B2
(45) Date of Patent: Oct. 1, 2019

(54) HYBRID LASER AND IMPLANT TREATMENT FOR OVERLAY ERROR CORRECTION

(71) Applicant: Applied Materials, Inc., Santa Clara, CA (US)

(72) Inventors: Mangesh Bangar, San Jose, CA (US); Srinivas D. Nemani, Sunnyvale, CA (US); Steve G. Ghanayem, Los Altos, CA (US); Ellie Y. Yieh, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 15/811,341

(22) Filed: Nov. 13, 2017

(65) Prior Publication Data
US 2018/0136569 A1 May 17, 2018

Related U.S. Application Data

(60) Provisional application No. 62/420,926, filed on Nov. 11, 2016.

(51) Int. Cl.
*G03F 7/20* (2006.01)

(52) U.S. Cl.
CPC .............. *G03F 7/70633* (2013.01)

(58) Field of Classification Search
None
See application file for complete search history.

(56) References Cited

U.S. PATENT DOCUMENTS

| | | | | |
|---|---|---|---|---|
| 4,257,825 A | * | 3/1981 | Schaumberg et al. | 148/1.5 |
| 5,877,036 A | * | 3/1999 | Kawai | G03F 7/70633 355/53 |
| 6,298,470 B1 | * | 10/2001 | Breiner | G03F 7/70625 257/E21.525 |
| 6,405,096 B1 | * | 6/2002 | Toprac | G03F 7/70633 257/E21.525 |
| 6,458,605 B1 | * | 10/2002 | Stirton | G03F 7/70633 438/7 |
| 6,596,604 B1 | | 7/2003 | Lojek et al. | |

(Continued)

FOREIGN PATENT DOCUMENTS

WO 2015/195272 A1 12/2015

OTHER PUBLICATIONS

International Search Report and Written Opinion for International Application No. PCT/US2015/033810 dated Aug. 31, 2015.

(Continued)

*Primary Examiner* — Carlos R Ortiz Rodriguez
(74) *Attorney, Agent, or Firm* — Patterson + Sheridan LLP

(57) ABSTRACT

Embodiments disclosed herein relate to methods and systems for correcting overlay errors on a surface of a substrate. A processor performs a measurement process on a substrate to obtain an overlay error map. The processor determines an order of treatment for the substrate based on the overlay error map. The order of treatment includes one or more treatment processes. The processor generates a process recipe for a treatment process of the one or more treatment processes in the order of treatment. The processor provides the process recipe to a substrate treatment apparatus.

20 Claims, 6 Drawing Sheets

(56) References Cited

U.S. PATENT DOCUMENTS

| | | | |
|---|---|---|---|
| 7,433,051 B2 | 10/2008 | Owen | |
| 2002/0145716 A1* | 10/2002 | Kurosawa | G03F 7/70358 355/55 |
| 2003/0209745 A1 | 11/2003 | Laibowitz et al. | |
| 2007/0065732 A1* | 3/2007 | Lee | B82Y 10/00 430/5 |
| 2007/0252963 A1 | 11/2007 | Modderman et al. | |
| 2007/0287239 A1 | 12/2007 | Yoon et al. | |
| 2010/0092881 A1 | 4/2010 | Mos et al. | |
| 2011/0223737 A1 | 9/2011 | Liu et al. | |
| 2012/0146159 A1 | 6/2012 | Wang et al. | |
| 2012/0154773 A1* | 6/2012 | Beyer | G03F 1/72 355/52 |
| 2013/0198697 A1 | 8/2013 | Hotzel | |
| 2014/0356982 A1* | 12/2014 | Barash | H01L 22/12 438/5 |
| 2016/0005662 A1 | 1/2016 | Yieh et al. | |
| 2016/0146740 A1 | 5/2016 | Lu et al. | |

OTHER PUBLICATIONS

International Search Report and Written Opinion dated Feb. 7, 2018 for Application No. PCT/US2017/059001.

* cited by examiner

HYBRID LASER AND IMPLANT TREATMENT FOR OVERLAY ERROR CORRECTION

CROSS-REFERENCE TO RELATED APPLICATIONS

This application claims priority to U.S. Provisional Patent Application Ser. No. 62/420,926, filed on Nov. 11, 2016, which herein is incorporated by reference.

BACKGROUND

Field

Embodiments described herein generally relate to a substrate processing system, and more specifically, to a pulse shape system for use in a processing chamber.

Description of the Related Art

In the manufacture of integrated circuits (IC), or chips, patterns representing different layers of the chip are created by a chip designer. A series of reusable masks, or photomasks, are created from these patterns in order to transfer the design of each chip layer onto a semiconductor substrate during the manufacturing process. Mask pattern generation systems use precision lasers or electron beams to image the design of each layer of the chip onto a respective mask. The masks are then used much like photographic negatives to transfer the circuit patterns for each layer onto a semiconductor substrate. These layers are built up using a sequence of processes and translate into the tiny transistors and electrical circuits that comprise each completed chip. Typically, devices on semiconductor substrates are manufactured by a sequence of lithographic processing steps in which the devices are formed from a plurality of overlying layers, each having an individual pattern. Generally a set of 15 to 100 masks may be used to construct a chip and can be used repeatedly.

Between one layer and the next layer that overlays the previous one, the individual patterns of the one layer and the next layer must be aligned. A measurement of alignment marks may be obtained by a metrology tool which is then used by a lithography tool to align the subsequent layers during exposure and again after a lithography process to recheck a performance of the alignment. However, film stress/strain variations (or pattern registration errors) between layers are inevitable, and error budgets are calculated by IC designers for which the manufacturing must meet. Film stress/strain variations of the device structure may originate from different error sources, such as film stress/strain variations from previous exposure tool/metrology tool, current exposure tool/metrology tool, a matching error between the film stress/strain variations of the previous exposure tool/metrology tool and of the current exposure tool/metrology tool, or substrate film layer deformation caused by film stress and the like.

Therefore, a need for an improved method for correcting overlay errors.

SUMMARY

Embodiments disclosed herein relate to methods and systems for correcting overlay errors on a surface of a substrate. A processor performs a measurement process on a substrate to obtain an overlay error map. The processor determines an order of treatment for the substrate based on the overlay error map. The order of treatment includes one or more treatment processes. The processor generates a process recipe for a treatment process of the one or more treatment processes in the order of treatment. The processor provides the process recipe to a substrate treatment apparatus.

In another embodiment, a system is disclosed herein. The system includes a first substrate treatment apparatus having a first metrology device, a second substrate treatment apparatus having a second metrology device, and a controller in communication with the first and second substrate treatment apparatuses. The controller includes a computer processor and a memory. The memory contains program code that, when executed on the computer processor, performs an operation of correcting overlay errors on a surface of a substrate. The processor performs a measurement process on a substrate to obtain an overlay error map. The processor determines an order of treatment for the substrate based on the overlay error map. The order of treatment includes one or more treatment processes. The processor generates a process recipe for a first treatment process of the one or more treatment processes in the order of treatment. The processor provides the process recipe to a substrate treatment apparatus.

In yet another embodiment, a computer readable storage medium is disclosed herein. The computer readable storage medium has stored thereon instructions that, when executed by a processor, causes the processor to perform an operation for correcting overlay errors on a surface of a substrate. The computer readable storage medium includes performing a measurement process on a substrate to obtain an overlay error map. An order of treating the substrate is determined based on the over error map. The order of treating the substrate includes one or more treatment processes. A first process recipe is generated for a first treatment process of the one or more treatment processes. A second process recipe is generated for a second treatment process of the one or more treatment processes. The first process recipe is provided to a first substrate treatment apparatus. The second process recipe is provided to a second substrate treatment apparatus.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Edge placement error has been established as one of the bigger challenges in the semiconductor industry for technology advancement that would follow Moore's law predictions. Overlay errors are a big part of the edge placement error, and results in non-uniformity arising from substrate processes, the lithography system, and overlay metrology. Process induced overlay errors have become significant for applications such as in 3DNAND, DRAM, and the like. High stress of the device stack layers often results in local distortions, which leads to overlay errors that cannot be addressed through traditional lithographic correction techniques alone. Additionally, process modifications during the device stack deposition and processing are not enough to address this pressing issue. Conventional techniques fail to meet both the stringent overlay and edge placement error requirements.

The present disclosure provides an improved method for correcting overlay errors on the substrate. The improved method implements both laser and implant methods, used in conjunction, to treat the substrate locally to correct the overlay errors and to improve the device performance and yield. This enables device scaling to meet the stringent overlay and edge placement error requirements.

Figure 1:
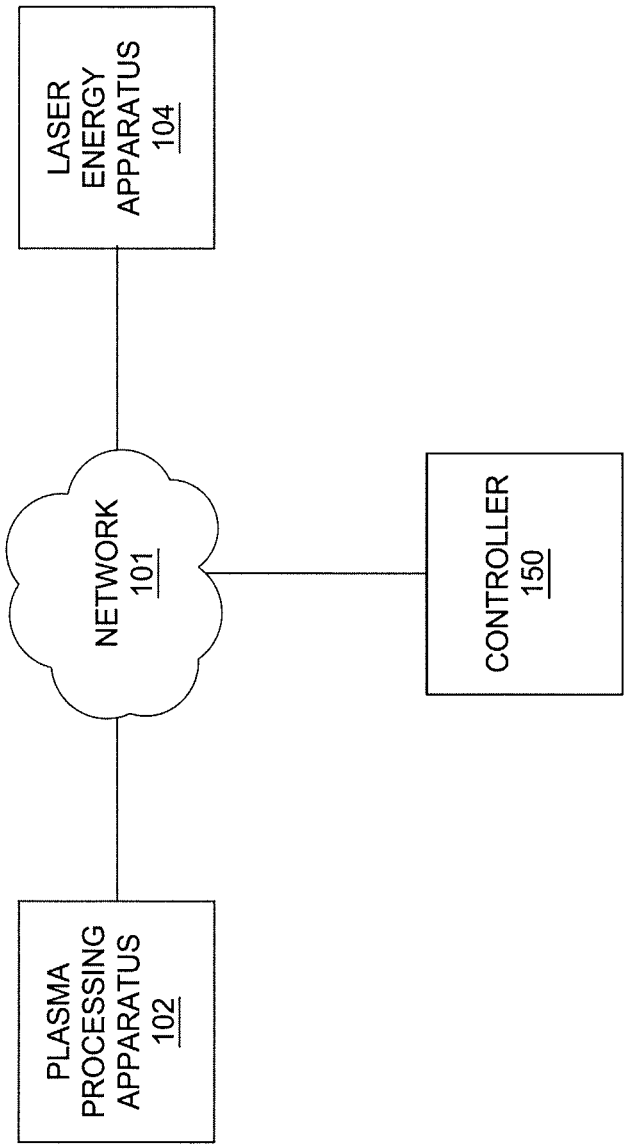
FIG. 1 illustrates a simplified view of a processing platform configured to carry out the method discussed below in conjunction with FIG. 4.

FIG. 1 illustrates a simplified view of a processing platform 100 configured to carry out the method discussed below in conjunction with FIG. 4. The processing platform 100 includes a plasma processing apparatus 102 and a laser energy apparatus 104. The plasma processing apparatus 102 may be utilized to implant electrons or ions into a film layer that may alter a stress/strain of the film layer so as to correct or repair overlay errors and/or EPE present on semiconductor devices. In some embodiments, the plasma processing apparatus 102 may be more traditional ion implantation apparatuses, such as beamline ion implantation apparatus, may be used to perform the methods described herein. Generally, controlling the implant beam shape and size imposes certain limitations such as, for smaller beam sizes, the beam current is limited, resulting in lower throughput. However, implant processes are able to modify stress on a wide range of materials as opposed to laser or thermal anneal based processes.

The laser energy apparatus 104 is used to provide laser energy to the film layer that may alter the stress/strain of the film layer so as to correct or treat film stress/strain variations present on semiconductor devices. The laser beam is able to be tuned to very fine dimensions for higher resolution without sacrificing dose per unit area. However, the laser processes imposes certain limitations, such as, limiting the range of materials eligible for the laser process.

In the present disclosure, the plasma processing apparatus 102 and the laser energy apparatus 104 are used in conjunction to treat the substrate locally to correct the overlay errors and to improve the device performance yield. Together, the implant process and the laser process would offer the widest range of stress modulation to address incoming substrate quality with a wide range of stress variations and non-uniformities. This is due to fact that, for most of the materials tested, implant treatment resulted in tensile modulation whereas laser treatment has shown compressive modulation. Thus, such a hybrid technique can offer high throughput with high resolution and the ability to work with a wide range of materials. It would allow, not only the improvement of production quality substrates, but also offer correction capabilities for substrates with process excursions or hot spots. It would also address the "age-old" problem for semiconductor industry of chamber/tool matching, in addition to aforementioned applications, thus offering significant yield improvements to semiconductor manufacturers.

The processing platform 100 further includes a controller 150 configured to carry out the method below discussed in conjunction with FIG. 4. In one embodiment, the controller 150 controls both the method and the processing carried forth by both the plasma processing apparatus 102 and the laser energy apparatus 104. In another embodiment, the controller 150 is configured to communicate with plasma processing apparatus 102 and laser energy apparatus 104 via their own respective controllers over a computing network (not shown).

Figure 2:
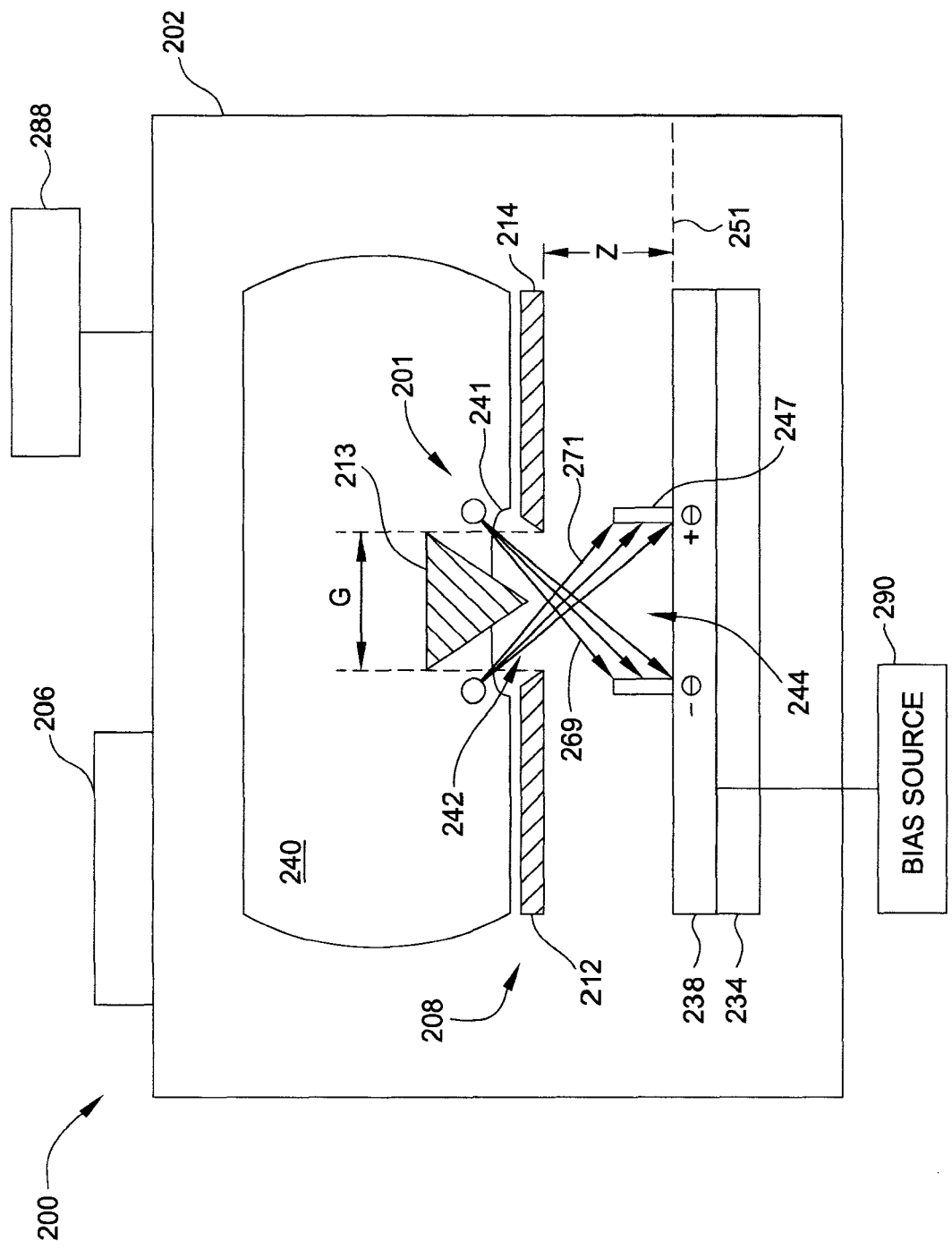
FIG. 2 illustrates the plasma processing apparatus, according to one embodiment.

FIG. 2 illustrates the plasma processing apparatus 102, according to one embodiment. One example of the plasma processing apparatus 102 may be the Varian VIISTA® Trident, commercially available from Applied Materials, Inc. in Santa Clara, Calif.

The plasma processing apparatus 102 includes a process chamber 202, a platen 234, a source 206, and a modifying element 208. The platen 234 may be coupled to an actuator (not shown) which may cause the platen 234 to move in a scanning motion. The scanning motion may be a back and forth movement within a single plane which may be substantially parallel to the modifying element 208. The source 206 is configured to generate the plasma 240 in the process chamber 202. The modifying element 208 includes a pair of insulators 212, 214, which may define a gap therebetween having a horizontal spacing (G). The insulators 212, 214 may comprise an insulating material, a semi-conducting material, or a conductive material. The modifying element 208 also includes a directional element 213 disposed in a position relative to the insulators 212, 214 such that ions 201 are provided towards the substrate 238.

In operation, as gas source 288 may supply an ionizable gas to the process chamber 202. Examples of an ignitable gas may include $BF_3$, $BI_3$, $N_2$, Ar, $PH_3$, $AsH_3$, $B_2H_6$, $H_2$, Xe, Kr, Ne, He, $CH_4$, $CF_4$, $AsF_5$, $PF_3$, and $PF_5$, among others. More specifically, species of ions may include He+, $H_3$+, $H_2$+, H+, Ne+, F+, C+, $CF_x$+, $C_xH_y$, N+, B+, $BF_2$+, $B_2H_x$+, Xe+, and molecular carbon, boron, or boron carbide ions. The source 206 may generate the plasma 240 by exciting and ionizing the gas provided to the process chamber 202. The ions 201 are attracted from the plasma 240 across the plasma sheath 242. For example, a bias source 290 is configured to bias the substrate 238 to attract the ions 201 from the plasma 240 across the plasma sheath 242. The bias source 290 may be a DC power supply to provide a DC voltage bias signal or an RF power supply to provide an RF bias signal.

The modifying element 208 modifies the electric field within the plasma sheath 242 to control a shape of the boundary 241 between the plasma 240 and the plasma sheath 242. The modifying element 208 includes the insulators 212, 214 and directional element 213 may be fabricated from materials such as quartz, alumina, boron nitride, glass, silicon nitride, and other suitable materials. The boundary 241 between the plasma 240 and the plasma sheath 242 is dependent upon the placement of the directional element 213 relative to the insulators 212, 214 as the directional element 213 may alter the electric field within the plasma sheath 242.

Ions 201 following a trajectory path 271 may strike the substrate 238 at about an angle of +θ normal to the plane 251. Ions 201 following trajectory path 269 may strike the substrate 238 at an angle of about −θ normal the plane 251. Accordingly, the range of incident angles normal to the plane 251 may be between about +1° and about −65° and a second range of incident angles may be between about −5° and about −65°. In one embodiment, the first range of incident angles relative to the plane 251 may be between +10° and about +20°. In addition, some ion trajectories, such as trajectory paths 269 and 271, may cross one another.

Depending on a number of factors including, but not limited to, the positioning of the directional element 213, horizontal spacing (G) between insulators 212, 214, the vertical spacing (Z) of the insulators 212, 214, above the plane 251, the dielectric constant of the directional element 213 and the insulators 212, 214 and other plasma processing parameters, the range of incident angles (theta), in one embodiment may be between about +89° and about −89°, exclusive of 0°.

In general, ions 201 provided to a film on the substrate may alter various characteristics of the film. The range of incident angles may be selected based upon an aspect ratio of a 3D feature on the substrate 238 or a localized stress profile of the film. For example, sidewalls 247 of a trench 244, having an exaggerated size for clarity of illustration, may be more uniformly treated by the ions 201 than with conventional plasma processing apparatuses and procedures. The aspect ratio, which may be defined as the relationship between a pitch between the sidewalls 247 and a height of the sidewalls 247 extending from the substrate 238, may determine the angels at which the ions 201 are provided to provide more uniform treatment on the sidewalls 247. For example, a first range of incident angles normal to the plane 251 and adapted to impact the sidewalls 247 may be between about +60° and about +90° and a second range of incident angles may be between about −60° and about −90°. In one embodiment, the first range of incident angles normal to the plane 251 and adapted to impact the sidewalls 247 may be between about −70° and about −80° and the second range of incident angles normal to the plane 251 and adapted to impact the sidewalls 247 may be between about +70° and about +80°. In one embodiment, angles at which the ions 201 are provided may be selected to avoid contact with material below the sidewalls 247, for example, the substrate 238 in one embodiment, or an insulator in another embodiment.

According to certain aspects, the plasma processing apparatus 102 is only one example of an apparatus that may be used. According to certain aspects, traditional plasma processing apparatuses may be used, pattern beams, electron beams (e.g., pulsed or continuous), raster scanning, variable scanning, and any other method of implanting ions 201 or electrons may be used. According to certain aspects, one or more energetic particle beams may include a cylindrical shaped beam, a plurality of adjacent or overlapping cylindrical beams, or a ribbon shaped beam (e.g., a continuous rectangular shaped beam). According to certain aspects, the one or more energetic particle beams can be moved relative to the substrate during processing and/or the substrate can be moved relative to the energetic particle beam during processing. According to certain aspects, different processing characteristics may be used, such as beam energy, beam angle, beam angle relative to the transfer direction of the substrate, beam composition (e.g., gas ions), or other useful property to the surface of the substrate.

Figure 3:
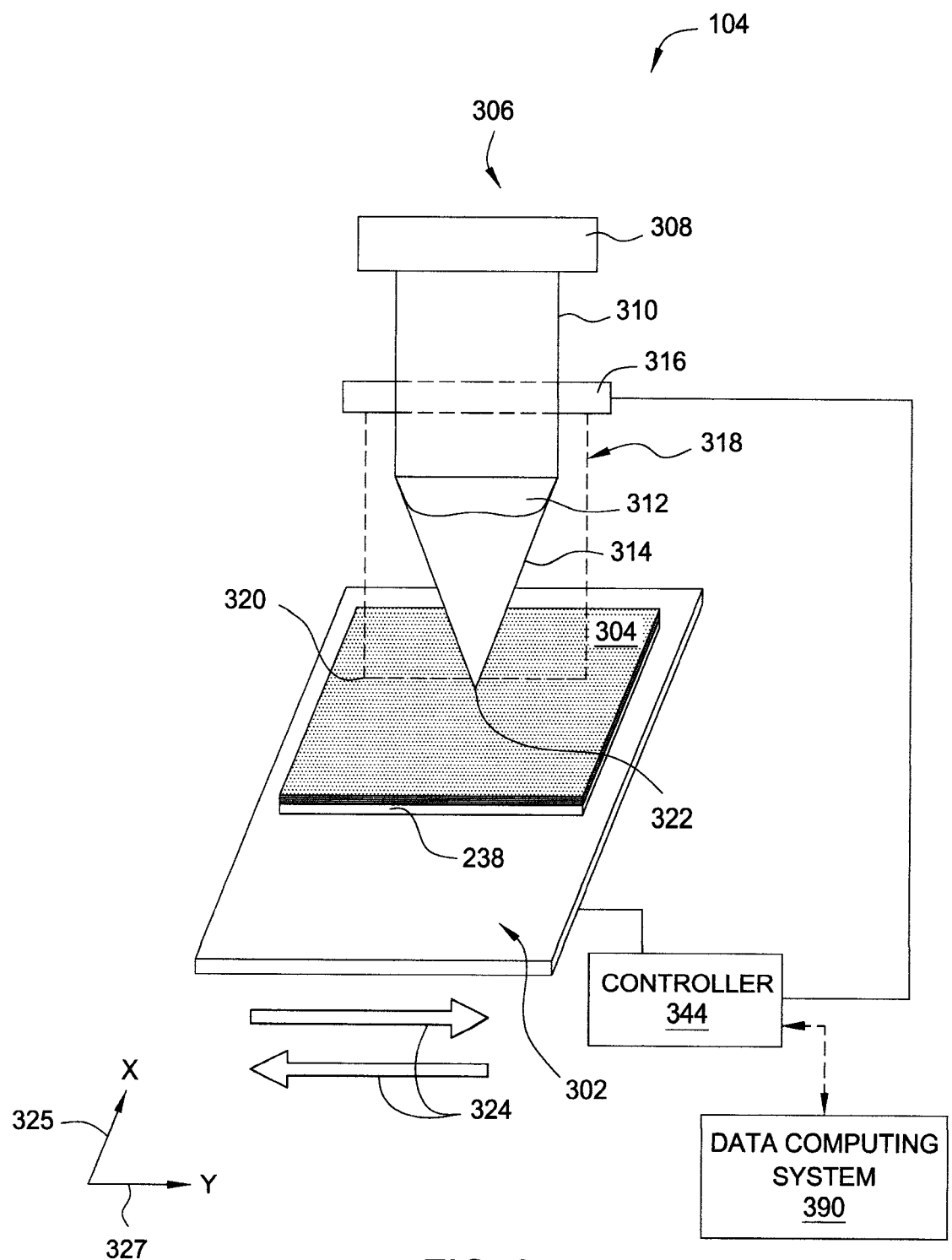
FIG. 3 illustrates the laser energy apparatus, according to one embodiment.

FIG. 3 illustrates the laser energy apparatus 104, according to one embodiment. The laser energy apparatus 104 includes a laser module 306, a stage 302, configured to support a substrate, such as the substrate 238, a translation mechanism 324 configured to control the movement of the stage 302. The laser module 306 comprises a laser radiation source 308 and an optical focusing module 310 disposed between the laser radiation source 308 and the stage 302.

In one embodiment, the laser radiation source 308 may be a light source made from Nd:YAG, Nd:YVO4, crystalline disk, diode pumped fiber, and other light source that can provide and emit a pulsed or continuous wave of radiation 314 at a wavelength between about 180 nm and about 2000 nm. For example, between about 260 nm and 405 nm. In another embodiment, the laser radiation source 308 may include multiple laser diodes, each of which produce uniform and spatially coherent light at the same wavelength. In yet another embodiment, the power of the cumulative laser diode(s) is in the range of about 10 watts to 200 watts.

The optical focusing module 310 transforms the radiation 314 emitted by the laser radiation source 308 using at least one lens 312 into a line, spot, or other suitable beam configuration, of radiation 314 directed at a film layer 304 disposed on the semiconductor substrate 301. The radiation 314 is selectively applied to a surface of the film layer 304 to provide laser energy doses to discrete predetermined regions of the film layer 304. In one embodiment, the radiation 314 may be selectively applied to the surface of the film layer 304 as many times as needed until a desired change in the stress present in the film layer 304 is obtained. In another architecture, the laser may be reflected off a digital micro-mirror device, such as Texas Instruments DLP chip, which then projects a laser pattern on the substrate (enlarged to treat the whole substrate or in a small field which is scanned across the substrate) to build up the treatment dosage map.

Lens 312 of the optical focusing module 310 may be any suitable lens, or series of lenses, capable of focusing radiation 314 into a line or spot. In one embodiment, lens 312 is a cylindrical lens. Alternatively, lens 312 may be one or more concave lenses, convex lenses, plane mirrors, concave mirrors, convex mirrors, refractive lenses, diffractive lenses, Fresnel lenses, gradient index lenses, or the like.

A detector 316 is disposed in the laser energy apparatus 104 above the stage 302. In one embodiment, the detector 316 may be an optical detector 316 that provides a light source with different wavelengths to inspect and detect film properties of the film layer 304 and/or the semiconductor substrate 301 positioned on the stage 302. In one embodiment, the detector 316 and light source may form part of an optical microscope (OM) that may be used to view individual device die pattern or features formed in the film layer 304, the substrate 301 and therebetween. In another embodiment, the detector 316 may be a metrology tool or a sensor capable of detecting local thickness, stress refractive index, surface roughness or resistivity on the film layer 304 and/or the substrate 301 prior to performing a laser energy process. In yet another embodiment, the detector 316 may include a camera that may capture images of the film layer 304 and/or the substrate 301 as to analyze the film layer 304 and/or the substrate 301 based on the image color contrast, image brightness contrast, image comparison, and the like. In another embodiment, the detector 316 may be any suitable detector 316 that may detect different film properties or characteristics, such as stress of the substrate or the film layers disposed on the substrate.

The detector 316 may linearly scan the substrate surface using a line of optical radiation 318 provided therefrom across a linear region 320 of the substrate 301. The detector 316 may also aid in identifying the coordinate, alignment, or orientation of the substrate 301. The detector 316 may scan the substrate 301 as the substrate 301 advances in an x-direction 325. Similarly, the detector 316 may scan the substrate 301 as the substrate 301 moves in a y-direction 327 as the translation mechanism 324 moves the stage 302. In one embodiment, the detector 316 may be coupled to a controller 344, so as to control movement and data transfer from the detector 316 or other detectors or computing system to the laser energy apparatus 104.

The controller 344 may be a high-speed computer configured to control the detector 316 and/or the laser module 306 to perform an optical detection process and/or a laser energy treatment process. In one embodiment, the optical detection process is performed by the detector 316 prior to the laser energy treatment process, so that the process parameters set in a laser energy treatment recipe for performing a laser energy process may be based on the measurement data received from the optical detection process. In one embodiment, the controller 344 may be further coupled to a data computing system 390 so as to assist determining a proper recipe to perform the laser energy treatment process on the film layer 304 of the substrate 301.

In one embodiment, the translation mechanism 324 may be configured to translate the stage 302 and the radiation 314 relative to one another. The translation mechanism 324 may be configured to move the stage 302 in different directions. In one embodiment, the translation mechanism 324 coupled to the stage 302 is adapted to move the stage 302 relative to the laser module 306 and/or the detector 316. In another embodiment, the translation mechanism 324 is coupled to the laser radiation source 308 and/or the optical focusing module 310 and/or the detector 316 to move the laser radiation source 308, the optical focusing module 310, and/or the detector 316 to cause the beam of energy to move relative to the substrate 301 that is disposed on the stationary stage 302. In yet another embodiment, the translation mechanism 324 moves the laser radiation source 308 and/or the optical focusing module 310, the detector 316, and the stage 302. Any suitable translation mechanism may be used, such as a conveyor system, rack and pinion system, or an x/y actuator, a robot, or other suitable mechanical or electromechanical mechanism to use for the translation mechanism 324. Alternatively, the stage 302 may be configured to be stationary, while a plurality of galvanometric heads (not shown) may be disposed around the substrate edge to direct radiation from the laser radiation source 308 to the substrate as needed.

The translation mechanism 324 may be coupled to the controller 344 to control the scan speed at which the stage 302, the line of radiation 314, and line of optical radiation 318 move relative to one another. The controller 344 may receive data from the detector 316 or from the data computing system 390 to generate an optimized laser energy recipe that is used to control the laser module 306 to perform an optimized laser dose patterning process. The stage 302 and the radiation 314 and/or the optical radiation 318 are moved relative to one another so that energy is delivered to discrete desired regions 322 of the film layer 304. In one embodiment, the translation mechanism 324 moves at a constant speed. In another embodiment, the translation of the stage 302 and movement of the line of radiation 314 and/or the line of optical radiation 318 follow different trajectory paths that are controlled by the controller 344.

Figure 4:
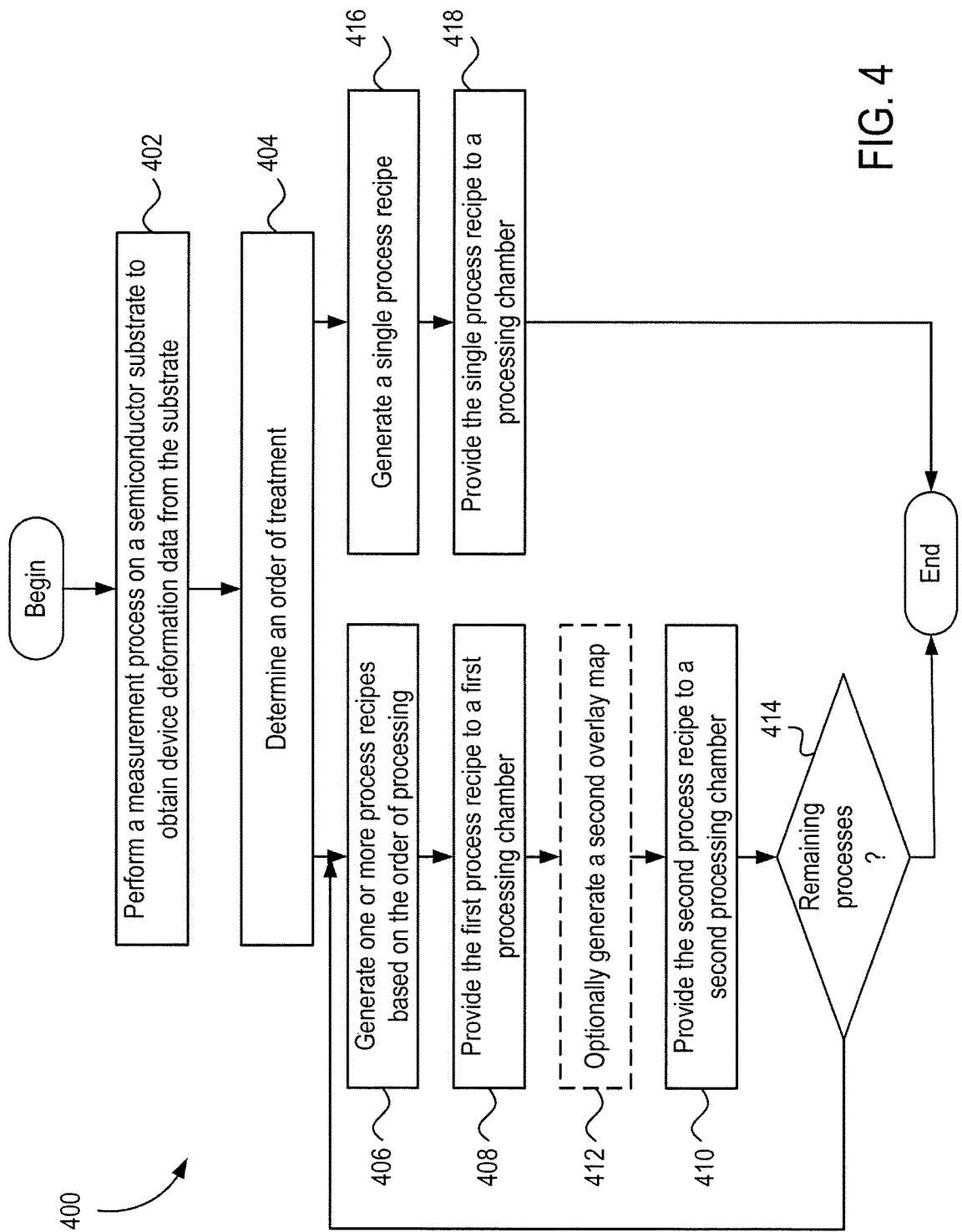
FIG. 4 is a flow diagram illustrating a method for correcting overlay errors, according to one embodiment.

FIG. 4 is a flow diagram illustrating a method 400 for correcting overlay errors, according to one embodiment. The method 400 discussed in conjunction with FIG. 4 may be carried out via the controller 150. In one embodiment, the controller 150 may control the processing parameters of the plasma processing apparatus 102 and the laser energy apparatus 104. In another embodiment, the controller 150 may communicate with each respective controller in carrying out the method 400, while allowing one controller to control the process parameters of plasma processing apparatus 102 and another controller to control the process parameters of laser energy apparatus 104.

Figure 5:
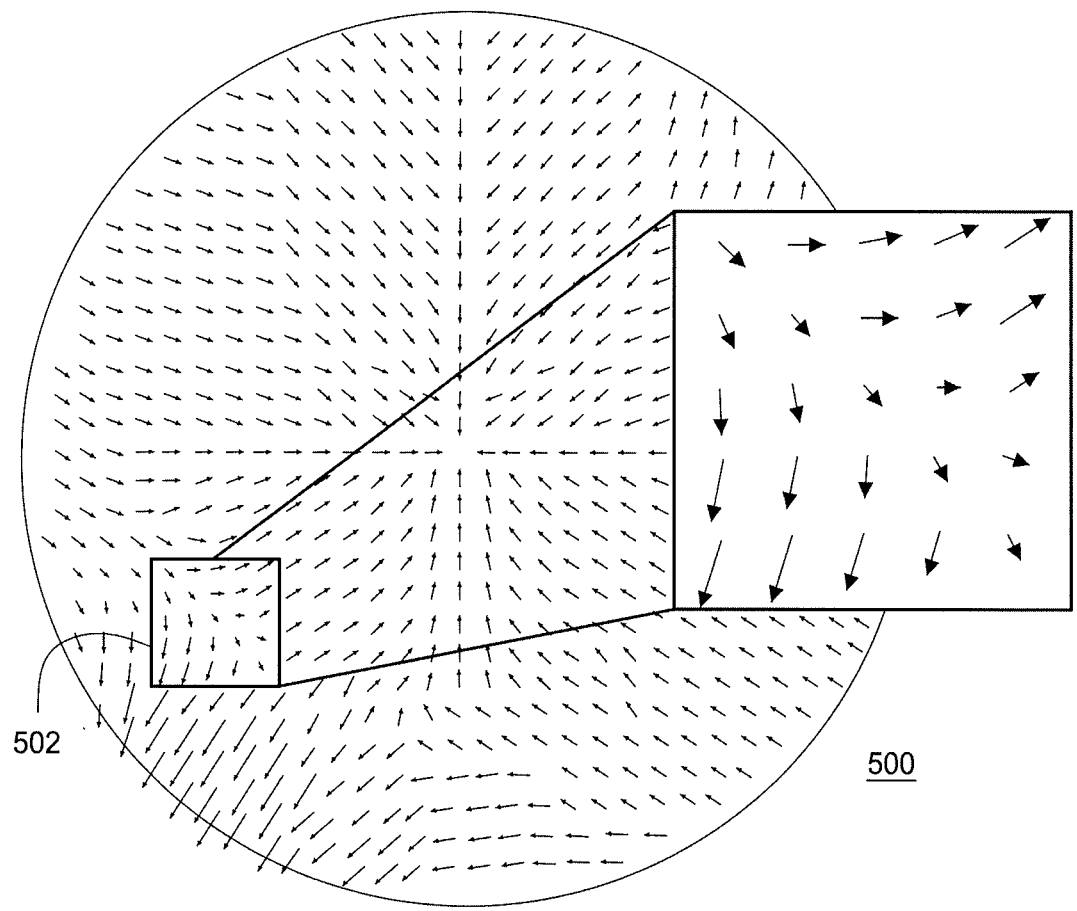
FIG. 5 illustrates an example of an overlay error map, according to one embodiment.

The method 400 begins at block 402. At block 402, the controller 150 performs a measurement process on a semiconductor substrate 301 to obtain device deformation data from the substrate. The device deformation data may be obtained by utilizing a metrology tool in communication with the controller 150 to scan the semiconductor substrate 301 to determine an overly error map. FIG. 5 illustrates an example of an overlay error map 500. In the embodiment of FIG. 5, some patterns shown in an enlarged portion 502 of the substrate are shifted or displaced from their designed location. As discussed, displacement or misalignment of the patterns creates film stress/strain variations that may be detrimental to device performance.

Referring back to FIG. 4, the metrology tool may be utilized to scan the semiconductor substrate 301 and determine the overlay error map 500 or substrate distortion may be determined using a metrology tool available from KLA-Tencor® of California. Prior to exposure, the controller 150 may measure in-plane distortion using a metrology tool such as the KLA Wafer Sense or the Ultratec Superfast 3G. After lithography one can use a conventional overlay tool to measure actual layer-to-layer pattern overlay and registration. It is noted that other suitable metrology tools from other manufacturer may also be utilized to perform the scan and measurement process.

In one embodiment, the overlay map or substrate distortion may be determined by measuring a film stress of the film layer 304 disposed on the semiconductor substrate 301. The deviation in the film stress distributed across the substrate surface may reflect the degree of film/stress variations or pattern displacement/shift present on the substrate 301.

At block 404, the controller 150 determines an order of treatment. The order of processing defines the one or more treatment processes the substrate 238 will undergo to correct overlays errors. The controller 150 determines the order of processing based on the data collected at block 402. In one example, the order of processing includes some combination of a laser treatment process and an implantation process. In another embodiment, the order of processing includes some combination of a high resolution laser treatment process and a low resolution laser treatment process. In yet another embodiment, the order of processing includes some combination of a high resolution implantation process and a low resolution implantation process. For example, a low resolution implant process followed by a high resolution laser treatment can offer substrate level, intra-die, and high local (i.e., hot spot) overlay correction capability with very large process window and material compatibility.

In one embodiment, after the controller 150 determines the order of treatment, the controller 150 generates one or more process recipes based on the order of processing and the overlay map (block 406).

For example, in the case where one of the one or more treatment processes is a laser energy treatment process, the controller 150 determines a proper laser energy treatment recipe based on the overlay error map 500 to be performed on the film layer 304 of the substrate 238 in order to reduce film stress/strain variations. The data computing system 390 may compare the data obtained from the substrate measurement process at block 402 with a database library or algorithm stored in the controller 150 to generate instructions that are readable by the controller X of the laser energy apparatus 104 to determine a proper laser energy treatment recipe to be performed on the substrate 238. The laser energy treatment recipe may alter, release, or eliminate localized residual stress in discrete regions of the film layer 304. This aids in locally changing the in-plane strain (or pattern shift, or substrate curvature) in the film layer 304. By doing so, a deformed projection field (die or dies) may be changed or modified and present substantially linear and uniform film patterns across the substrate surface. The straightened features allow for reduced film stress/strain variations in the subsequent lithographic exposure process, enhancing alignment precision during the lithographic exposure process.

In another example, for the case where one of the one or more treatment processes is an implant process, the controller 150 determines an implantation/doping treatment process to be performed on the substrate 238. For example, the implantation/doping treatment may be performed using at least on of a plasma beam, electron beam, ribbon beam or particle beam. The implantation/doping treatment process may include altering a film stress locally or globally in a film layer 304 disposed on the substrate 238 and/or correcting the determined overlay error or substrate distortion found on the substrate. In some embodiments the doping repair recipe may be determined in response to a film stress, substrate curvature, in plane distortion, or pattern shift detected on the substrate 238.

At block 408, the controller 150 provides the first process recipe to a first processing chamber to begin the first treatment process. The first processing chamber is chosen based on the determined order of processing. For example, the first treatment process may be a low resolution implant process or a high resolution implant process in a plasma processing apparatus, such as plasma processing apparatus 102. In another example, the first treatment process may be a low resolution laser process or a high resolution laser process performed in a laser energy apparatus, such as laser energy apparatus 104.

At block 410, after the substrate 238 undergoes the first treatment process in the first processing chamber, the controller 150 provides a second process recipe to a second processing chamber to begin the second treatment process. The second processing chamber is chosen based on the determined order of processing. For example, the second treatment process may be a low resolution laser process or a high resolution laser process performed in a laser energy apparatus, such as laser energy apparatus 104. This hybrid, multiple treatment process method offers much higher stress modulation process window, better film compatibility, high resolution and reasonable throughputs compared to each individual approach.

In some embodiments, prior to block 410, the controller 150 may generate a second overly map (optional block 412). For example, the controller 150 performs a second measurement process on a semiconductor substrate 301 to obtain a second set of device deformation data from the substrate. The process is similar to that in block 402. Obtaining a second overlay map and generating a second process recipe for the second treatment process may increase reliability of the overlay correction process.

At block 414, the controller 150 determines whether there are any more treatment processes in the order of treatment. If there are additional treatment processes in the order of treatment, at block 414 the method 400 reverts to block 406 to generate additional process recipes. If there are not any additional treatment processes in the order of treatment, the method 400 ends.

In another embodiment, after the controller 150 determines the order of treatment, the controller 150 generates a single process recipe based on the order of processing and the overlay map (block 416). For example, the controller 150 determines whether the substrate will undergo a laser treatment process or an implant process. At block 418, the controller 150 provides the single process recipe to a processing chamber to begin the treatment process. For example, the processing chamber 202 may be a plasma processing apparatus 102 implementing a high resolution or low resolution implant process or a laser energy apparatus 104 implementing a low resolution or a high resolution laser process.

Figure 6:
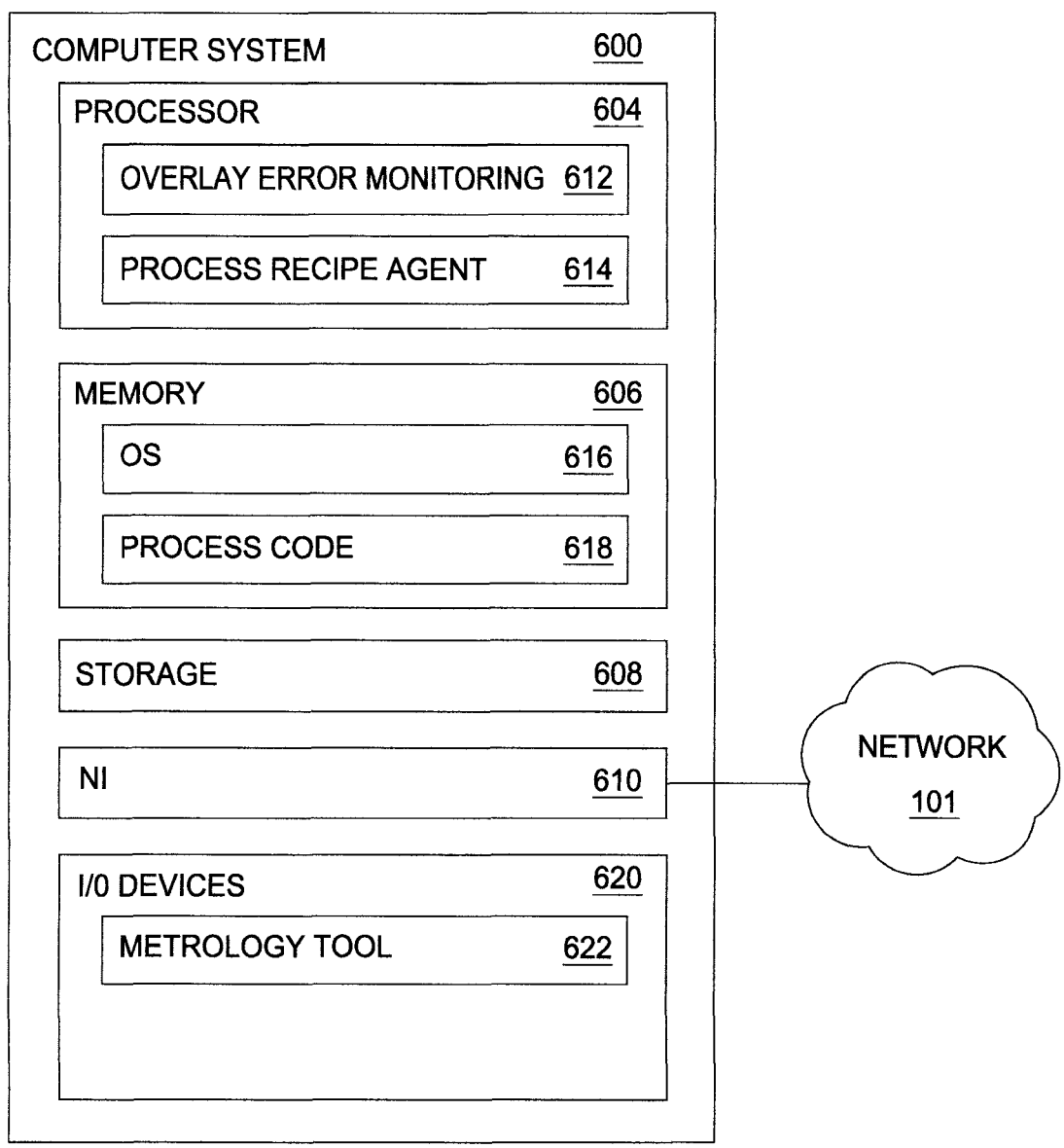
FIG. 6 illustrates a computer system, according to one embodiment.

FIG. 6 illustrates a computer system 600, such as controller 150, according to one embodiment. The computer system 600 includes a processor 604, a memory 606, storage 608, and network interface 610. The processor 604 may be any processor capable of performing the functions described herein. The computer system 600 may connect to network 101 using the network interface 610. Furthermore, as will be understood by one of ordinary skill in the art, any computer system 600 capable of performing the functions described herein may be used.

The processor 604 includes an overlay error monitoring system 612 and a process recipe agent 614. The overlay error monitoring system 612 is configured to generate one or more overlay maps based on device deformation data that may be obtained by utilizing a metrology tool 622 in the I/O devices 620 that are in communication with the computer system 600. The metrology tool 622 scans the semiconductor substrate 301 to obtain the device deformation data. The process recipe agent 614 is configured to determine an order of processing based off the deformation data. For example, the process recipe agent 614 is configured to determine the one or more treatment processes the substrate will undergo. Additionally, the process recipe agent 614 may be configured to determine the one or more process recipes for each respective treatment process based off the device deformation data.

In the pictured embodiment, the memory 606 includes an operating system 616 and program code 618. Although memory 606 is shown as a single entity, memory 606 may include one or more memory devices having blocks of memory associate with physical addresses, such as random access memory (RAM), read only memory (ROM), flash memory, or other types of volatile and/or non-volatile memory. The program code 618 is generally configured to carry out the overlay correction method 400 discussed above in conjunction with FIG. 4. The memory 606 is an example of tangible media configured to store data such as generated overlay error maps, orders of processing, and process recipes. Other types of tangible media include floppy disks, removable hard disks, optical storage media, such as CD-ROMs and DVDs, and bar codes, and the like.

While the foregoing is directed to specific embodiments, other and further embodiments may be devised without departing from the basic scope thereof, and the scope thereof is determined by the claims that follow.

What is claimed is:

1. A method for correcting errors on a surface of a substrate, comprising:
   performing a measurement process on a substrate to obtain an error map before lithography;
   determining an order of treatment for the substrate based on the error map before lithography,
      wherein the order of treating the substrate includes one or more treatment processes, and
         the one or more treatment processes comprises one of:
            a combination of the laser treatment process and the implant process,
            a combination of a high resolution laser treatment process and a low resolution laser treatment process, and
            a combination of a high resolution implant process and a low resolution implant process;
   generating a process recipe for a treatment process of the one or more treatment processes in the order of treatment before lithography; and
   providing the process recipe to a substrate treatment apparatus before lithography.

2. The method of claim 1, wherein performing a measurement process on the substrate to obtain the error map comprises:
   obtaining device deformation data using a metrology tool that scans the surface of the substrate.

3. The method of claim 1, where providing the process recipe to the substrate treatment apparatus comprises:
   providing a laser energy treatment recipe to a laser energy apparatus based on a dose of laser energy determined to correct substrate errors.

4. The method of claim 1, further comprising:
   generating a second process recipe for a second treatment process of the one or more treatment processes in the order of treatment; and
   providing the second process recipe to a second substrate treatment apparatus.

5. The method of claim 4, wherein providing the second process recipe to the second substrate treatment apparatus comprises:
   providing a doping recipe to an implant treatment apparatus based on the second process recipe to correct substrate overlay errors.

6. The method of claim 4, wherein providing the second process recipe to the second substrate treatment apparatus comprises:
   providing a second laser energy treatment recipe to a second laser energy apparatus based on a second dose of laser energy determined to correct substrate errors.

7. The method of claim 4, wherein providing the process recipe to the substrate treatment apparatus comprises:
   providing a doping recipe to an implant treatment apparatus based on the first process recipe to correct substrate errors.

8. The method of claim 7, wherein providing the second process recipe to the second substrate treatment apparatus comprises:
   providing a laser energy treatment recipe to a laser energy apparatus based on a dose of laser energy determined to correct substrate errors.

9. A system, comprising:
   a first substrate treatment apparatus having a first metrology device;
   a second substrate treatment apparatus having a second metrology device; and
   a controller in communication with both the first and second substrate treatment apparatuses, the controller comprising:
   a computer processor; and
   a memory containing program code that, when executed on the computer processor, performs an operation of correcting errors on a surface of a substrate, the operation comprising:
   performing a measurement process on a substrate to obtain an error map before lithography;
   determining an order of treating the substrate based on the error map before lithography,
      wherein the order of treating the substrate includes one or more treatment processes, and
         the one or more treatment process comprises one of:
            a combination of the laser treatment process and the implant process,
            a combination of a high resolution laser treatment process and a low resolution laser treatment process, and
            a combination of a high resolution implant process and a low resolution implant process;
   generating a process recipe for a treatment process of the one or more treatment processes in the order of treatment before lithography; and
   providing the process recipe to the substrate treatment apparatus before lithography.

10. The system of claim 9, wherein performing a measurement process on the substrate to obtain the error map comprises:
    obtaining device deformation data using a metrology tool that scans the surface of the substrate.

11. The system of claim 9, where providing the process recipe to the substrate treatment apparatus comprises:
    providing a laser energy treatment recipe to a laser energy apparatus based on a dose of laser energy determined to correct substrate errors.

12. The system of claim 9, further comprising:
    generating a second process recipe for a second treatment process of the one or more treatment processes in the order of treatment; and
    providing the second process recipe to a second substrate treatment apparatus.

13. The system of claim 12, wherein providing the second process recipe to the second substrate treatment apparatus comprises:
    providing a doping recipe to an implant treatment apparatus based on the second process recipe to correct substrate errors.

14. The system of claim 12, wherein providing the second process recipe to the second substrate treatment apparatus comprises:
    providing a second laser energy treatment recipe to a second laser energy apparatus based on a second dose of laser energy determined to correct substrate errors.

15. The system of claim 12, wherein providing the process recipe to the substrate treatment apparatus comprises:
    providing a doping recipe to an implant treatment apparatus based on the first process recipe to correct substrate errors.

16. The system of claim 15, wherein providing the second process recipe to the second substrate treatment apparatus comprises:
    providing a laser energy treatment recipe to a laser energy apparatus based on a dose of laser energy determined to correct substrate errors.

17. A non-transitory computer readable storage medium having stored thereon instructions that, when executed by a processor, causes the processor to perform an operation for correcting errors on a surface of a substrate, comprising:
performing a measurement process on a substrate to obtain an error map before lithography;
determining an order of treating the substrate based on the error map,
wherein the order of treating the substrate includes one or more treatment processes, and
the one or more treatment process comprises one of:
a combination of the laser treatment process and the implant process,
a combination of a high resolution laser treatment process and a low resolution laser treatment process, and
a combination of a high resolution implant process and a low resolution implant process;
generating a process recipe for a treatment process of the one or more treatment processes in the order of treatment before lithography; and
providing the process recipe to a substrate treatment apparatus before lithography.

18. The non-transitory computer readable storage medium of claim 17, wherein performing a measurement process on the substrate to obtain the error map comprises:
obtaining device deformation data using a metrology tool that scans the surface of the substrate.

19. The non-transitory computer readable storage medium of claim 17, where providing the first process recipe to the first substrate treatment apparatus comprises:
providing a laser energy treatment recipe to a laser energy apparatus based on a dose of laser energy determined to correct substrate errors.

20. The non-transitory computer readable storage medium of claim 17, further comprising:
generating a second process recipe for a second treatment process of the one or more treatment processes in the order of treatment; and
providing the second process recipe to a second substrate treatment apparatus.

* * * * *